(12) United States Patent
Chan et al.

(10) Patent No.: US 8,053,981 B2
(45) Date of Patent: Nov. 8, 2011

(54) ORGANIC LIGHT-EMITTING DEVICE, AND METHODS OF FORMING THE SAME AND ELECTRONIC DEVICES HAVING THE SAME

(75) Inventors: Chuan-Yi Chan, Taipei (TW); Du-Zen Peng, Zhubei (TW)

(73) Assignee: Chimei Innolux Corporation, Chu-Nan (TW)

( * ) Notice: Subject to any disclaimer, the term of this patent is extended or adjusted under 35 U.S.C. 154(b) by 706 days.

(21) Appl. No.: 12/151,517

(22) Filed: May 7, 2008

(65) Prior Publication Data
US 2009/0009070 A1    Jan. 8, 2009

(30) Foreign Application Priority Data
Jul. 5, 2007 (TW) ................................ 96124468 A (51) Int. Cl.
*H01J 1/62* (2006.01)
*H01J 63/04* (2006.01)

(52) U.S. Cl. ........ 313/506; 313/483; 313/500; 313/501; 313/502; 313/503; 313/504; 313/505

(58) Field of Classification Search .................. None
See application file for complete search history.

(56) References Cited

U.S. PATENT DOCUMENTS

| 2005/0200270 A1* | 9/2005 | Kwak et al. | 313/502 |
| 2005/0285540 A1* | 12/2005 | Koo et al. | 315/169.1 |
| 2006/0001091 A1* | 1/2006 | Kim | 257/347 |
| 2006/0001092 A1* | 1/2006 | Kim | 257/347 |
| 2007/0188079 A1* | 8/2007 | Song et al. | 313/504 |

FOREIGN PATENT DOCUMENTS
KR   2005098532 A   * 10/2005

OTHER PUBLICATIONS

English machine translation of Park et al (KR 2005-098532).*

* cited by examiner

*Primary Examiner* — Natalie Walford
(74) *Attorney, Agent, or Firm* — Liu & Liu (57) ABSTRACT

An organic light-emitting device and methods of forming the same are provided. The organic light-emitting device includes: a substrate having a pixel area and a peripheral circuit area; a reflective layer on the substrate, the reflective layer having a first reflective part in the pixel area and a second reflective part in the peripheral circuit area; a first electrode layer having a first part on the first reflective part; a pixel definition layer on the substrate, the pixel definition layer forming a plurality of pixel openings to expose a portion of the first part of the first electrode layer and at least one electrode contact hole to expose the second reflective part; an organic light-emitting layer on the first electrode layer; and a second electrode layer on the organic light-emitting layer, the second electrode layer extending to the peripheral circuit area to electrically couple with the exposed area of the second reflective part.

19 Claims, 9 Drawing Sheets

ORGANIC LIGHT-EMITTING DEVICE, AND METHODS OF FORMING THE SAME AND ELECTRONIC DEVICES HAVING THE SAME

CROSS REFERENCE TO RELATED APPLICATIONS

This application claims the right of priority based on Taiwan Patent Application No. 096124468 entitled "organic light emitting device, and methods of forming the same and electronic devices having the same," filed on Jul. 5, 2007, which is incorporated herein by reference and assigned to the assignee herein.

FIELD OF THE INVENTION

This invention relates to an organic light-emitting device, and more particularly, to an organic light-emitting device for resolving the broken electrode issue and increasing the light-emitting area, and methods of forming the same and an electronic device having the same.

BACKGROUND OF THE INVENTION

In recent years, the organic light-emitting displays are widely used in many consumer electronic products due to those advantageous characteristics, such as self-luminescence, wide viewing angle, high response speed, high color saturation and flexile panels. Generally, an organic light emitting display includes a plurality of light-emitting units formed on a substrate, and each light-emitting unit includes two electrodes (such as a metal cathode and an ITO anode) and a light-emitting organic material sandwiched therebetween. A control circuit provides signals to control the light-emitting units so that the organic light-emitting device can display image.

Figure 1A:
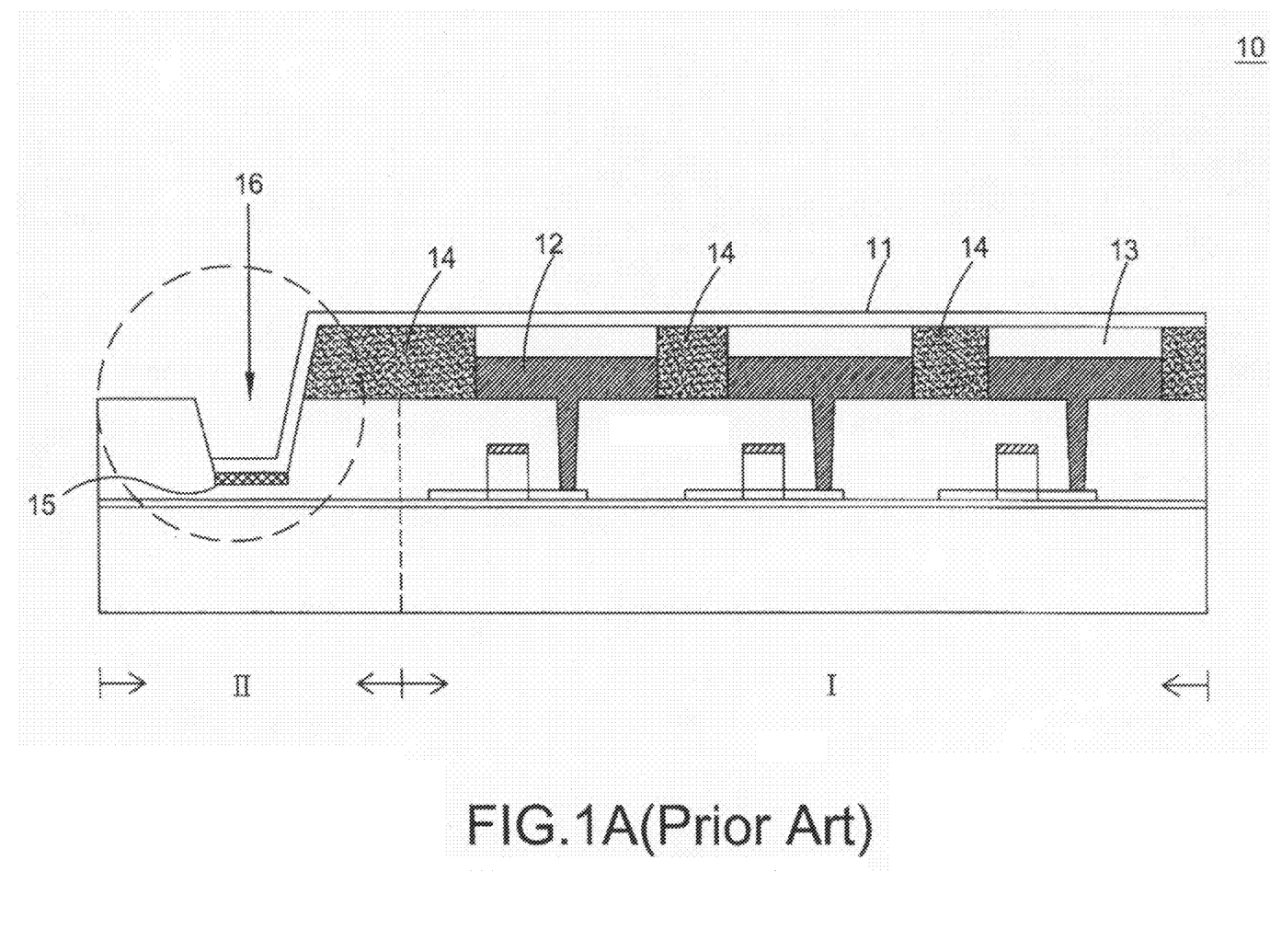
FIG. 1A and FIG. 1B are cross-sectional views of conventional organic light-emitting devices.
Figure 1B:
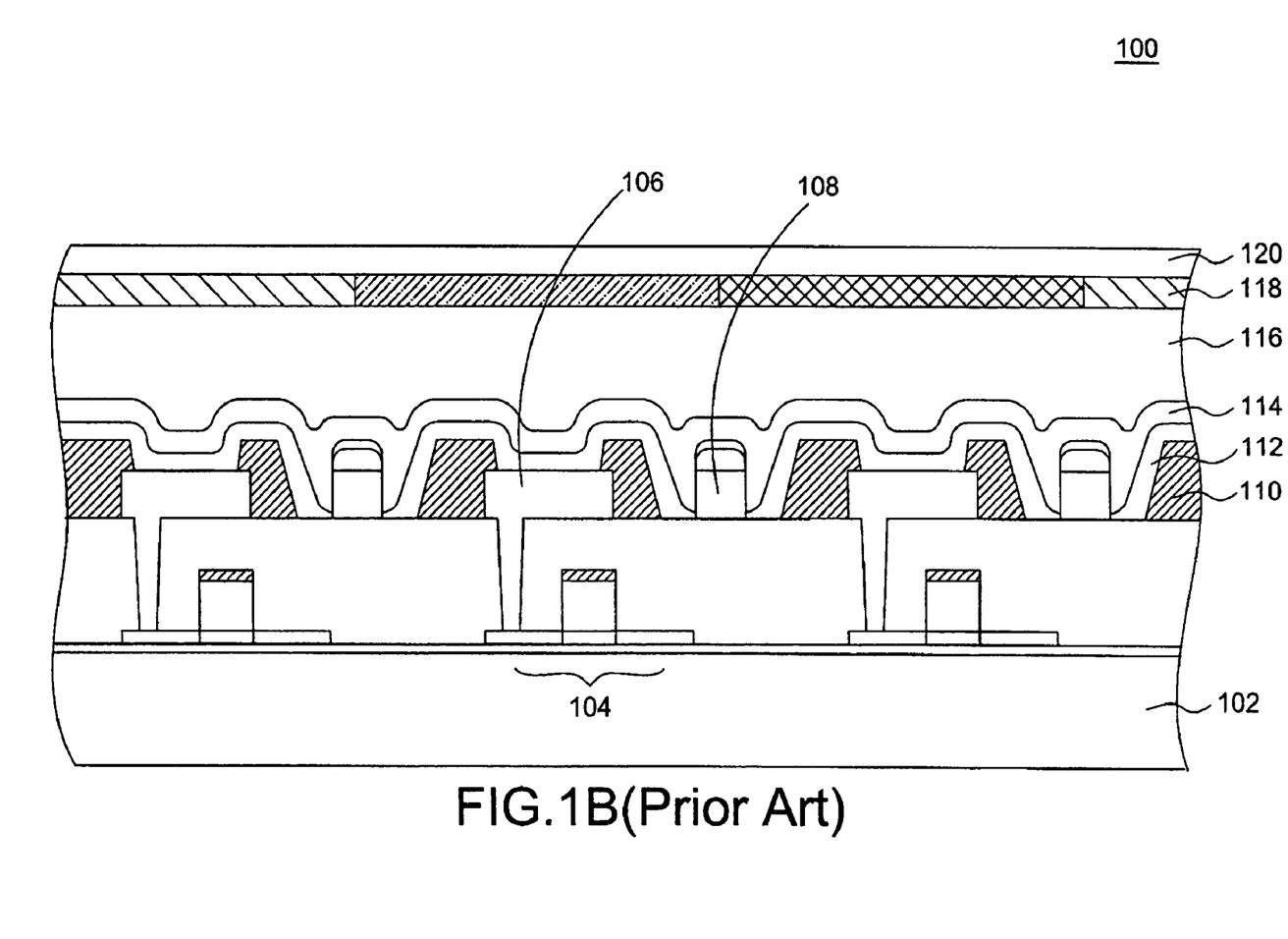

FIG. 1A is a cross-sectional view of a conventional organic light-emitting device 10. In FIG. 1A, in a pixel area 1, a cathode layer 11 of the organic light-emitting device 10 is formed over an anode layer 12, an organic light-emitting layer 13, and an pixel definition layer 14. The cathode layer 11 is typically a thin metal layer with a thickness about 10 to 200 angstroms. Generally, the cathode layer 11 is extended to contact a signal layer 15 in a peripheral circuit area 11 in order to inhibit voltage drop, and in turn, prevent variation of display luminance. However, the cathode layer 11 in the peripheral circuit area 11 is prone to damage (i.e. broken) because the aspect ratio of the contact hole 16 is too high and the cathode layer 11 is too thin. FIG. 1B is a cross-sectional view of another conventional organic light-emitting device 100 in the related art. An auxiliary electrode is employed between pixels in a pixel area and electrically connected to an electrode layer of the light-emitting units to inhibit the voltage drop. As shown in FIG. 1B, the organic light-emitting device 100 includes a transistor unit 104 on a bottom substrate 102, a first electrode layer 106 (such as an anode) in a pixel area electrically connected to the transistor unit 104, the auxiliary electrode 108, a pixel definition layer 110, an organic light-emitting layer 112, a second electrode layer 114 (such as a cathode) on the organic light-emitting layer 112, a planarization layer 116, a filter layer 118, and an upper substrate 120. The cathode 114 is electrically connected to the auxiliary electrode 108 to ensure the electrical connection intact even if the electrode is damaged. However, this kind of organic light-emitting device also has some drawbacks. For example, every pixel needs to sacrifice certain areas to serve as contact regions of the cathode electrode 114 so that the available light-emitting area is decreased, and the resolution and the possible shrinkage of the display are restricted.

Thus, it is desired to have an organic light-emitting device which can avoid the broken electrode issue without decreasing the light-emitting area, and a method of forming the same.

SUMMARY OF THE INVENTION

One aspect of the present invention is to provide an organic light-emitting device with appropriate electrode connection without an additional auxiliary electrode in the pixel area.

Another aspect of the present invention is to provide an organic light-emitting device having a reflective layer in the peripheral circuit area electrically connected to the electrode so as to resolve the broken electrode issue.

Another aspect of the present invention is to provide an organic light-emitting device with increased effective light-emitting area to facilitate the shrinkage of the display panel.

Further aspect of the present invention is to provide a method of forming an organic light-emitting device with an electrode contact in the peripheral circuit area compatible with current processes without complicating the process flow.

In an embodiment of the present invention, an organic light-emitting device is provided. The organic light-emitting device includes a substrate having a pixel area and a peripheral circuit area; a reflective layer on the substrate, the reflective layer having a first reflective part in the pixel area and a second reflective part in the peripheral circuit area; a first electrode layer having a first part on the first reflective part; a pixel definition layer on the substrate, the pixel definition layer defining a plurality of pixel openings to expose a portion of the first part of the first electrode layer, and at least one electrode contact hole to expose a portion of the second reflective part; an organic light-emitting layer on the first part of the first electrode layer; and a second electrode layer on the organic light-emitting layer, the second electrode layer extending to the peripheral circuit area to electrically contact the exposed portion of the second reflective part.

In another embodiment of the present invention, a method of forming an organic light-emitting device is provided. The method includes the steps of providing a substrate, the substrate having a pixel area and a peripheral circuit area; forming a reflective layer on the substrate, the reflective layer having a first reflective part in the pixel area and a second reflective part in the peripheral circuit area; forming a first electrode layer on the substrate, the first electrode layer having a first part on the first reflective part; forming a pixel definition layer on the substrate, the pixel definition layer defining a plurality of pixel openings to expose a portion of the first part of the first electrode layer and at least one electrode contact hole to expose a portion of the second reflective part; forming an organic light-emitting layer on the first electrode layer; and forming a second electrode layer on the organic light-emitting layer, the second electrode layer extending to the peripheral circuit area to electrically contact the exposed portion of the second reflective part.

Additionally, in another embodiment of the present invention, an electronic device is provided. The electronic device includes an image display system. The image display system includes an organic light-emitting device as recited above, and an input unit coupled to the organic light-emitting device and configured to provide a signal controlling the organic light-emitting device to display image.

DETAILED DESCRIPTION OF THE INVENTION

The drawings are provided for illustrative purposes only and, as such, they are not drawn to scale. The invention itself, however, both as to organization and method of operation, may best be understood by reference to the detailed description which follows taken in conjunction with the accompanying drawings. In the embodiments of the present invention, the same or like reference numbers will be used throughout the drawings to refer to the same or like parts.

Figure 2:
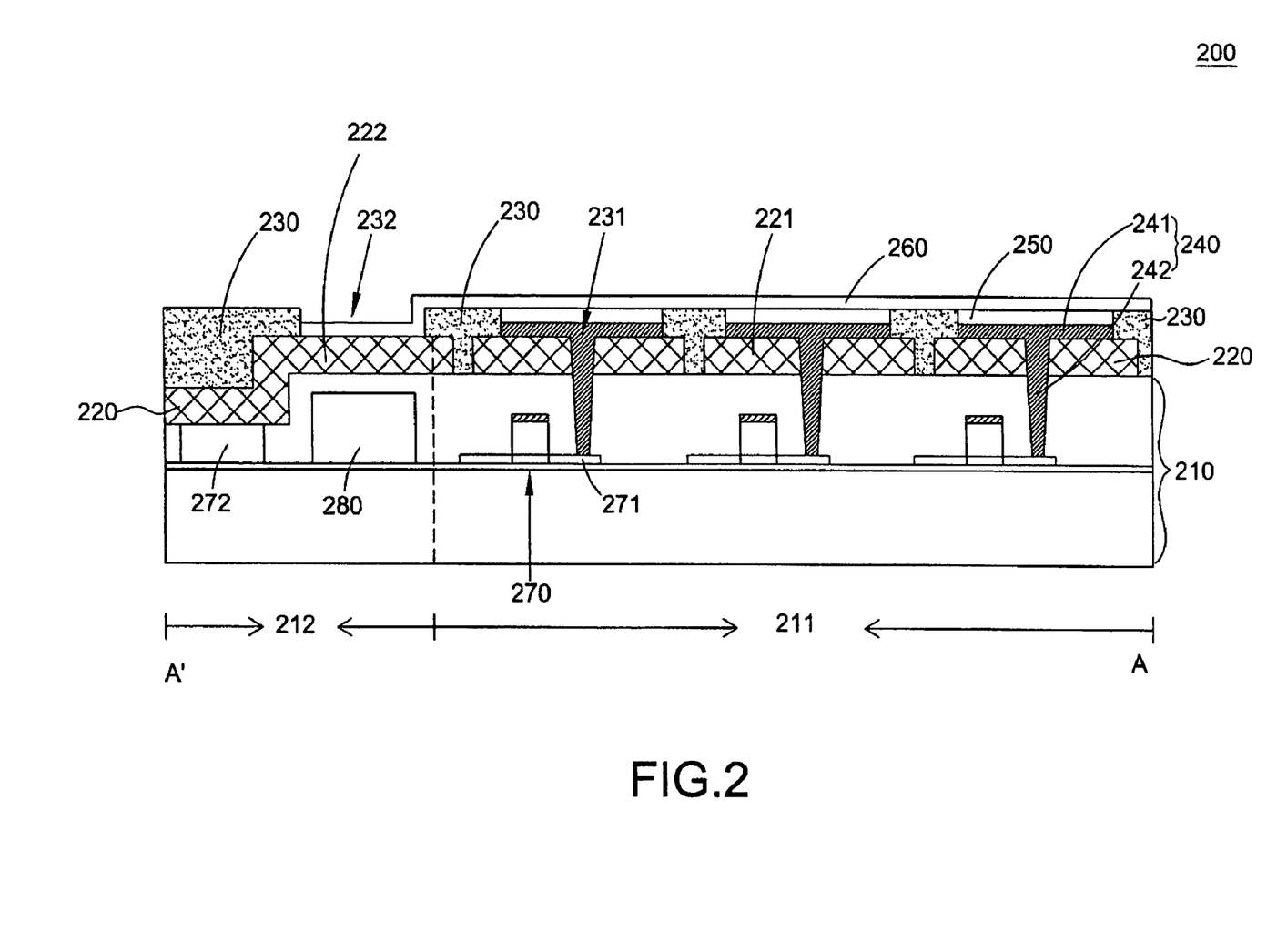
FIG. 2 is a cross-sectional view of an organic-light emitting device in accordance with a first embodiment of the present invention.

Referring to FIG. 2, a cross-sectional view of an organic-light emitting device 200 is shown in accordance with a first embodiment of the present invention. In the embodiment, the organic-light emitting device 200 is illustrated with a top emission organic light-emitting device. As shown in FIG. 2, the organic light-emitting device 200 includes a substrate 210 having a pixel area 211 and a peripheral circuit area 212. For example, the pixel area 211 is generally the center region of the display panel for displaying information, and the peripheral circuit area 212 is generally the peripheral region of the display panel used for control/driving circuits. A transistor 270 including a device electrode layer 271 (such as source/drain regions) is formed in the pixel area 211 of the substrate 210. It is noted that the transistor 270 formed in the pixel area 271 is used to control the pixels. Besides, a signal electrode layer 272 and a peripheral circuit system 280 (including the transistors for the peripheral circuit) also can be formed in the peripheral circuit area 212 of the substrate 210. That is, the signal electrode layer 272 and the device electrode layer 271 may be formed by a same conductive layer but function differently in the peripheral circuit area 212 and the pixel area 211 according to the design needs.

As shown in FIG. 2, a reflective layer 220 is formed on the substrate 210. The reflective layer 220 includes a first reflective part 221 in the pixel area 221 and a second reflective part 222 in the peripheral circuit area 212. Depending on the design of the reflective layer 220, the first reflective part 221 and the second reflective part 222 may be electrically insulated or conducted. The reflective layer 220 is typically a metal layer, and the metal material includes, but is not limit to, Sn, Al, Au, Pt, An, Ge, Ag, and the likes. Preferably, the reflectance of the metal material is at least 60%. Alternatively, the reflective layer 220 may be a multi-layer structure including at least one metal described above or the combination thereof with other suitable materials. The reflective layer 220 is configured to reflect the light emitted from the organic light-emitting layer 250 (described below in more detail).

Figure 3A:
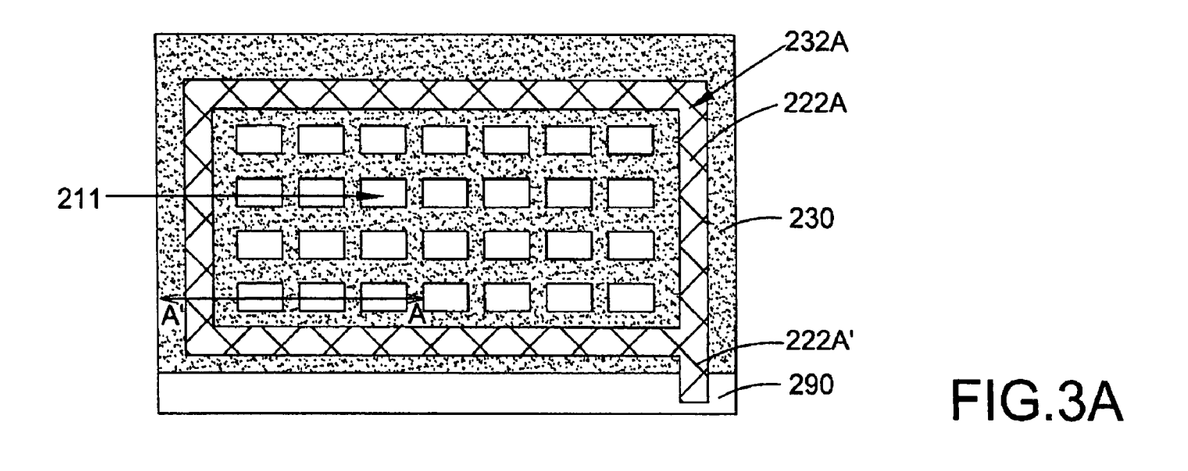
FIG. 3A to FIG. 3E are top views of the reflective layer pattern and the electrode contact hole in the peripheral circuit area in accordance with different embodiments of the present invention.

A pixel definition layer 230 is formed on the substrate 210 to define a plurality of pixel openings 231 to expose a first electrode layer 240 (described below in more detail) formed in the pixel area 211 and at least one electrode contact hole 232 to expose the second reflective part 222. The pixel definition layer 230 defines each pixel unit (such as the pixel opening 231) in the pixel area 211 so as to avoid the circuit short between the pixels. Moreover, the pixel definition layer 230 also defines at least one electrode contact hole 232 for electrical connection of the second electrode layer 260 (described below in more detail). The pixel definition layer 230 is generally formed by inorganic or organic materials, such as, but not limited to, silicon oxide or polyimide. The structure of the organic-light emitting device 200 formed by the method described above may be referred to the portion indicated by the cross-sectional line A-A' shown in FIG. 3. However, the drawings are provided for illustrative purposes only, and the present invention is not limited to the details given herein. For example, the line A-A' may indicate any portion including the electrode contact hole 232, and not deliberated hereinafter.

Referring to FIG. 3A to FIG. 3E, the top views of various patterns of the reflective layer 220 and the electrode contact holes 232 in the peripheral circuit area 212 are shown in accordance with embodiments of the present invention. In these embodiments, the organic-light emitting device 200 further includes a plurality of pixel units in the pixel area 211. It is understood that the drawings are provided for illustrative purposes only and, as such, they are not drawn to scale, so that the amount and locations of the pixel units may be changed depending on the design needs.

Figure 3B:
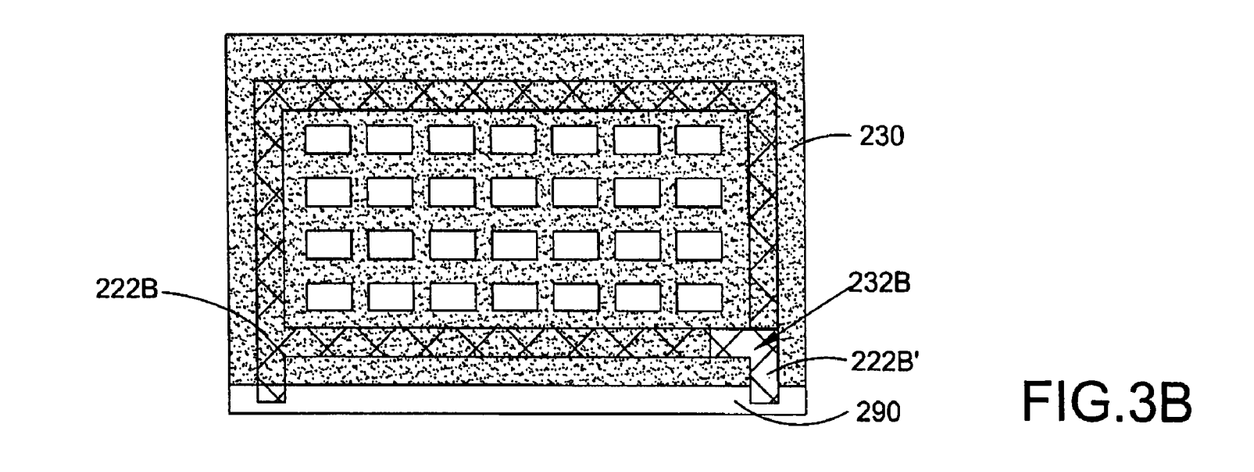
Figure 3C:
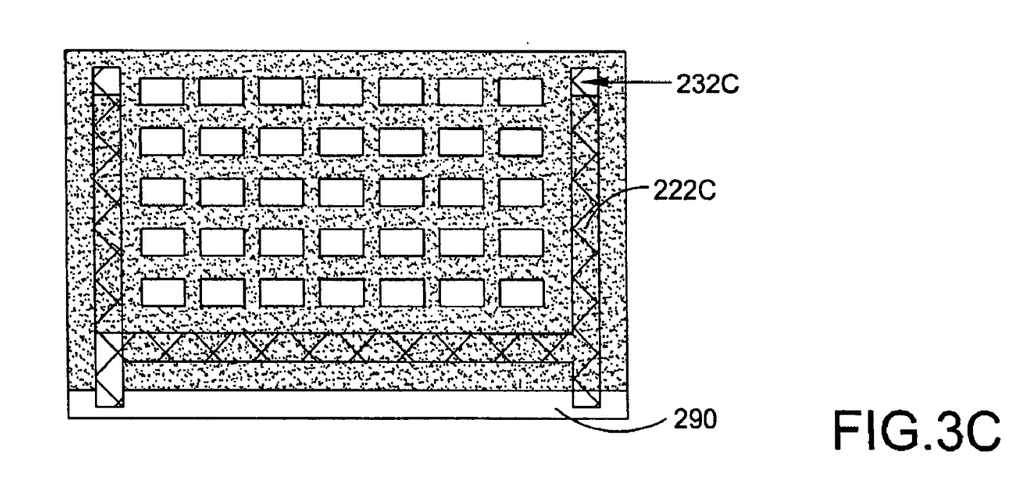
Figure 3D:
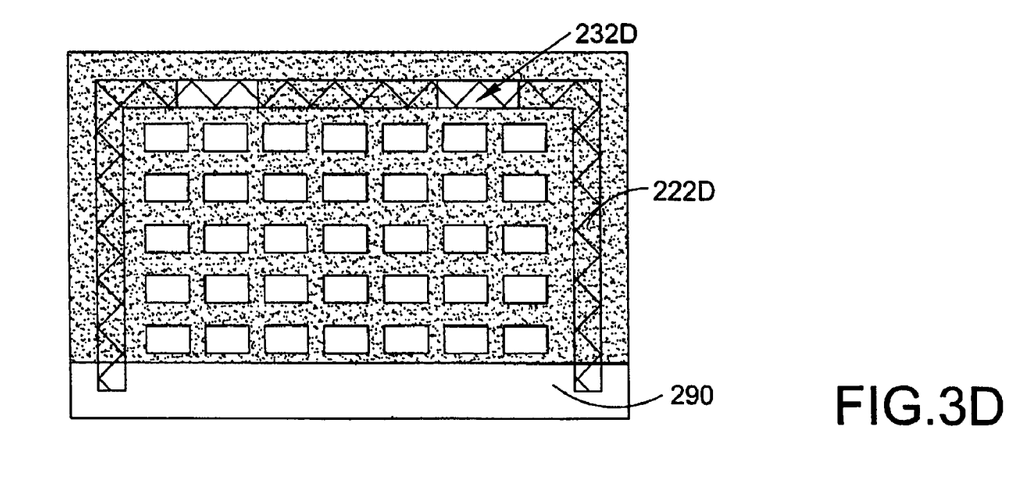
Figure 3E:
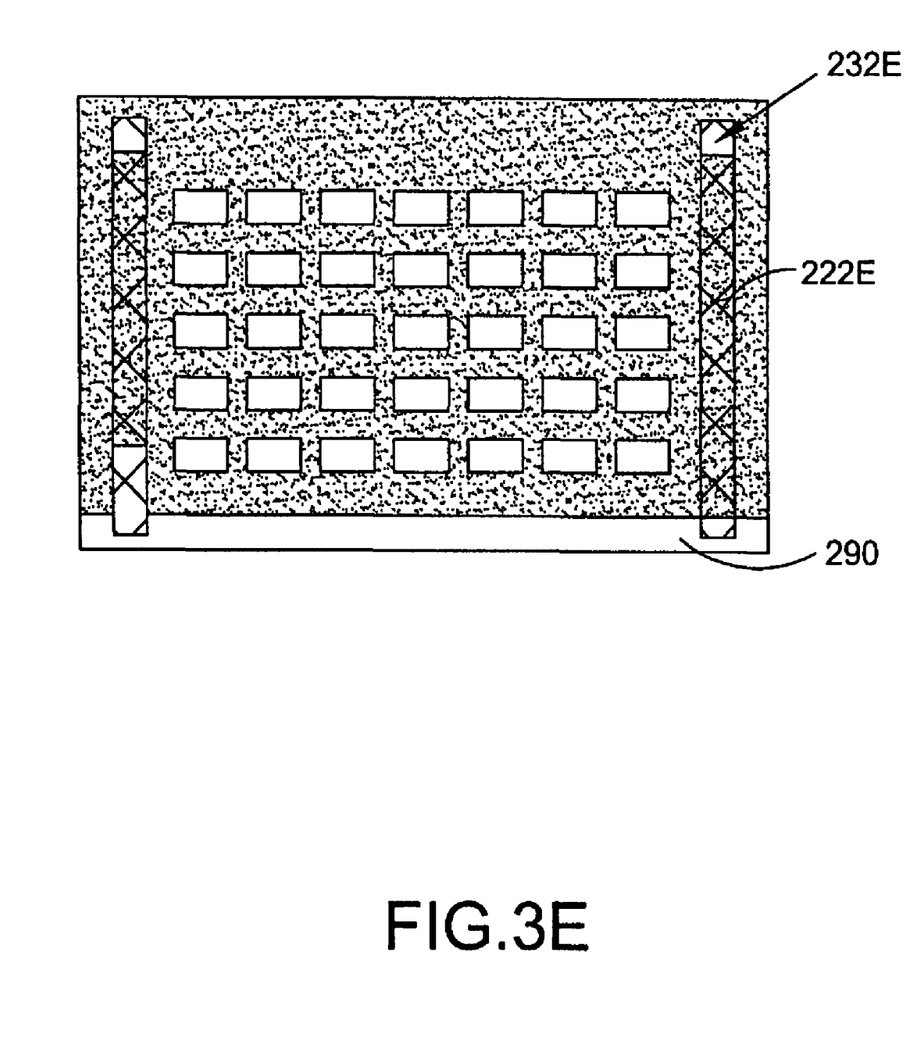

Noted that the reflective layer 220 in the peripheral circuit area 212 (i.e. the second reflective part 220) of the organic-light emitting device 200 may have different arrangement according to different application and is not limited to the exemplary embodiments herein. In one embodiment, as shown in FIG. 3A and FIG. 3B, the second reflective part 222A and 222B may be patterned in a rectangular shape and have protrusions 222A' and 222B' to connect with an integrated circuit pad 290 of the organic-light emitting device 200. In another embodiment, as shown in FIG. 3C, the second reflective part 222C may be patterned in "H" shape and has a protrusion to connect with the integrated circuit pad 290. In an alternative embodiment, as shown in FIG. 3D, the second reflective part 222D may be patterned in "U" shape and is connected to the integrated circuit pad 290. In a further embodiment, as shown in FIG. 3E, the second reflective part 222E may be patterned in two-parallel-stripe shape and is connected to the integrated circuit pad 290. It is noted that the various shapes are considered as illustrative and not restriction. In FIG. 3A to FIG. 3E, please note that the reflective layer 220, such as the first reflective part 221, is also presented in the pixel openings 231 but not shown for the clarity of the drawings.

Furthermore, the shape, the amount, and the position of the electrode contact hole may be modified according to different applications. In one embodiment, as shown in FIG. 3A, the electrode contact hole 232A may be patterned in rectangular shape to expose the rectangular second reflective part 222A. In another embodiment, as shown in FIG. 3B, the electrode contact hole 232B may be patterned to expose a portion of the second reflective part 222B, such as the protrusion 222B'. In other embodiments, as shown in FIGS. 3C, 3D and 3E, the electrode contact holes 232C, 232D, and 232E are formed different in shape, amount, and position. Noted that the second electrode layer 260 formed in subsequent steps will electrically contact the exposed portion of the second reflective part 222 in the electrode contact hole 232.

The first electrode layer 240 serving as a first electrode of the organic light-emitting device is electrically connected to the device electrode layer 271 of the transistor 270. In this embodiment, as shown in FIG. 2, the first electrode layer 240 having a first part 241 and a second part 242 is formed in the pixel opening 231. The first part 241 is formed on the reflective layer 220 and adjacent to the pixel definition layer 230, and the second part 242 passing through the first reflective part 221 of the reflective layer 220 is electrically coupled with the device electrode layer 271 of the transistor 270. The organic light-emitting layer 250 is formed on the first electrode layer 240 as a light-emitting layer of the organic light-emitting device. In this embodiment, the organic light-emitting layer 250 is formed on the first electrode layer 240 in the pixel area 211. The organic light-emitting layer 250 can be formed by conventional light-emitting materials and be a stack structure including, for example, an electric hole transport layer, a light-emitting layer, an electron transport layer, as well-known in the art. The second electrode layer 260 is formed on the organic light-emitting layer 250 and extended to the peripheral circuit area 212 to electrically connected to the reflective layer 220. For example, the second electrode layer 260 is extended to the peripheral circuit area 212 and electrically connected to the exposed portion of the reflective part 222 defined by the electrode contact hole 232.

In the embodiment, the first electrode layer 240 and the second electrode layer 260 can be corresponding cathode or anode. Namely, when the first electrode layer 240 is an anode, the second electrode layer 260 is a cathode; alternatively, when the first electrode layer 240 is a cathode, the second electrode layer 260 is an anode. In general, the anode of the organic light-emitting device is made of a conductive material having a high work function, such as indium tin oxide (ITO) and indium zinc oxide (IZO), and the cathode is a conductive material having a low work function, for example Au, Ag, Al, Cu and Cr and alloys of these materials. In this embodiment, the first electrode layer 240 is an anode (such as ITO), and the second electrode layer 260 is a cathode. In this embodiment, the anode is made of a transparent ITO, so that the reflective layer 220 is arranged under the anode to reflect the light emitted from the organic light-emitting layer 250 in order to obtain a top emission type organic light-emitting device. Furthermore, the thickness of the second electrode layer 260 typically is less then 300 nm with a light transmittance capability, and preferably is less than 200 nm.

Referring to FIG. 2 again, in a preferred embodiment, the reflective layer 220 has a first reflective part 221 and a second reflective part 222. The first reflective part 221 is formed in the pixel area 211, and the second reflective part 222 is simultaneously formed in the peripheral circuit area 212 to electronically contact the signal electrode layer 272 in the peripheral circuit area 212. Then, the second electrode layer 260 is electrically coupled with the exposed portion of the second reflective part 222 in the peripheral circuit area 212. Thus, in the present invention, the aspect ratio of the second electrode layer 260 in the contact hole 232 can be adjusted by adjusting the thickness of the reflective layer 220, so that the second electrode layer 260 can be easily formed and free of broken defect. Furthermore, the second reflective part 222 of the reflective layer 220 can be flexibly arranged on the peripheral circuit system 280 to save the substrate area. In addition, by electrically connecting the second electrode layer 260 with the second reflective part 222 in the peripheral circuit area 212 overcomes the prior art drawbacks of wasting the light-emitting area when an auxiliary electrode is employed.

In the following description, various embodiments of the present invention are illustrated and described, and similar components (i.e. the same or like reference numbers) will have the similar properties and characters in the foregoing embodiments and are not deliberated hereinafter.

Figure 4:
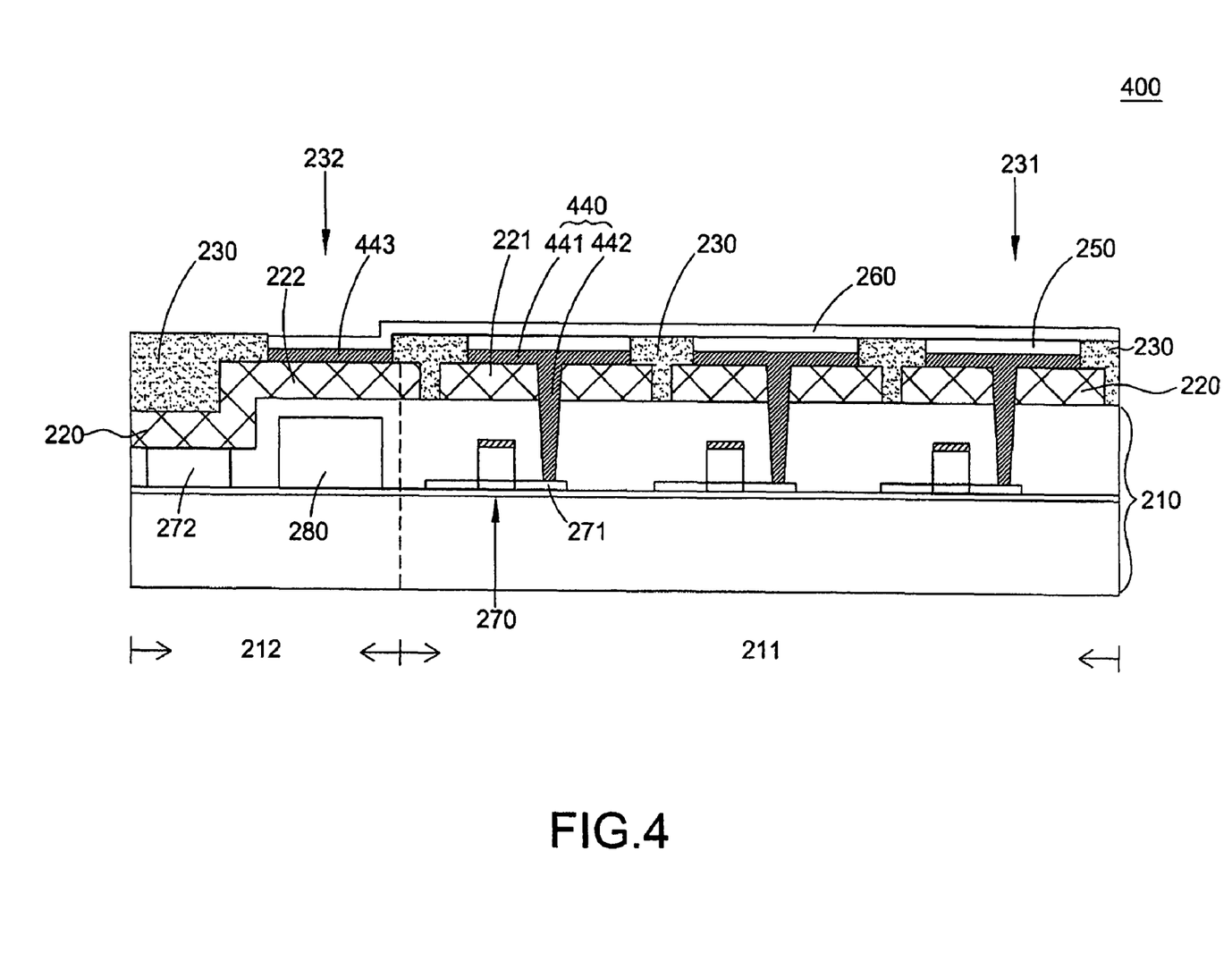
FIG. 4 is a cross-sectional view of an organic-light emitting device in accordance with a second embodiment of the present invention.

In a second embodiment of the present invention, as shown in FIG. 4, different from the organic light-emitting device 200 of the first embodiment, the organic light-emitting device 400 includes an additional electrode layer in the peripheral circuit area 212, which is simultaneously formed when the first electrode layer is formed in the pixel area 211. That is, the first electrode layer and the additional electrode layer are formed by the same process. In FIG. 4, the first electrode layer 440 having a first part 441 and a second part 442 is formed in the pixel area 211, and the additional electrode layer 443 is simultaneously formed in the peripheral circuit area 212. The first part 441 of the first electrode layer 440 is arranged on the exposed portion of the first reflective part 221 defined by the pixel opening 231 in the pixel area 211, and the second part 442 of the first electrode layer 440 passing through the reflective layer 220 is electrically coupled with the device electrode layer 271 of the transistor 270. The additional electrode layer 443 is formed on the exposed portion of the second reflective part 222 defined by the electrode contact hole 232 in the peripheral circuit area 212. Because the existence of the additional electrode layer 443 in the contact hole 232, the second electrode layer 260 can be electrically coupled with the exposed portion of the second reflective part 222 through the additional electrode layer 443. Thus, the vertical connection distance from the second electrode layer 260 through the additional electrode layer 443 to the second reflective part 222 is decreased, so that the second electrode layer 260 is prevented from the broken issue.

Figure 5:
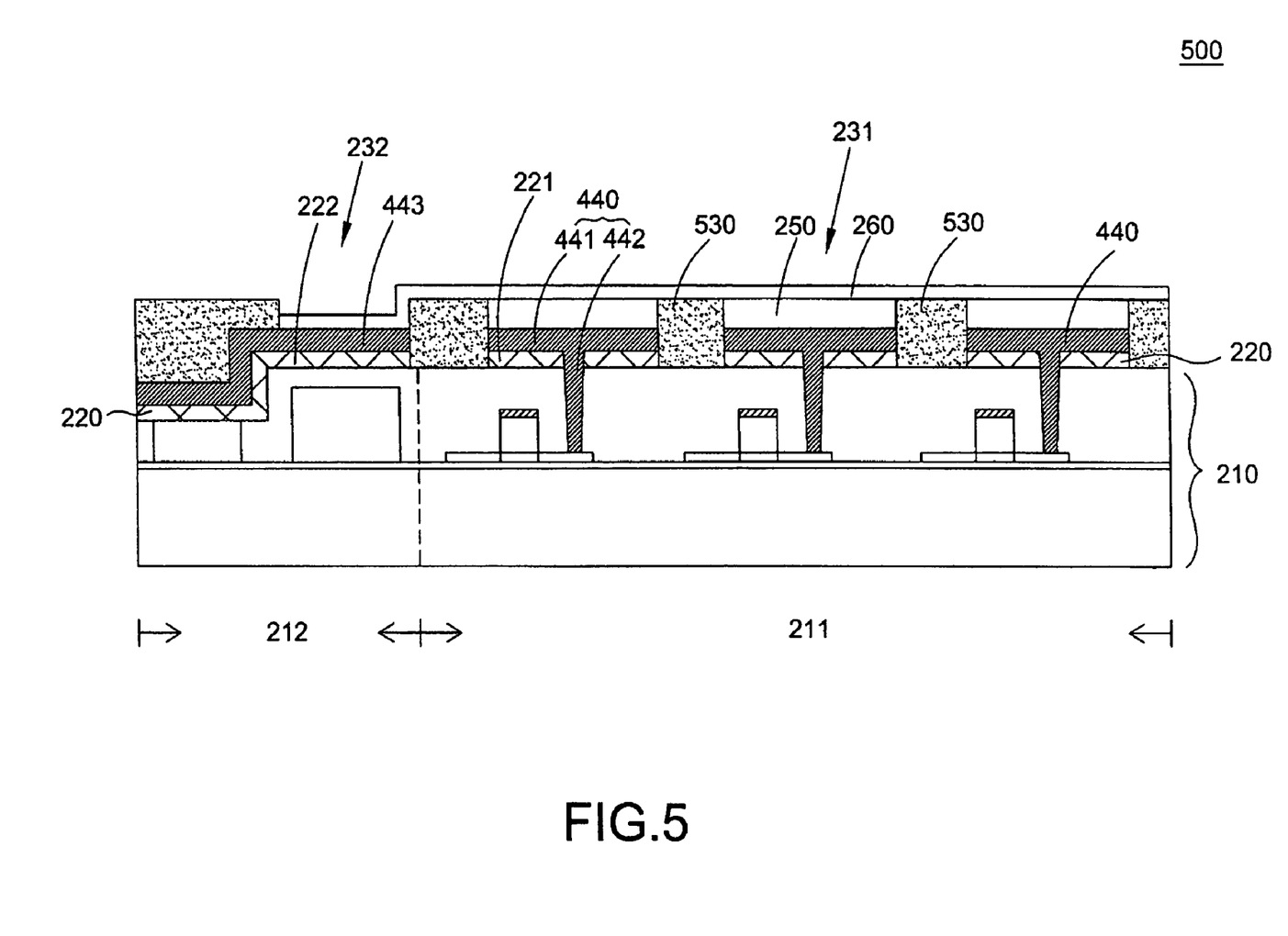
FIG. 5 is a cross-sectional view of an organic-light emitting device in accordance with a third embodiment of the present invention.

FIG. 5 is a cross-sectional view of an organic-light emitting device 500 in accordance with a third embodiment of the present invention. As shown in FIG. 5, compared with the organic light-emitting device 200 and 400, the pixel definition layer 530 in the pixel area 211 of the organic-light emitting device 500 is a rectangular shape instead of a T shape as illustrated for the pixel definition layer 230 in the pixel area in the above-mentioned embodiments. Thus, in this embodiment, the first reflective part 221 is adjacent to the pixel definition layer 530 in the plurality of pixel openings 231. However, when the pixel definition layer is a T shape, a portion of the first reflective part 221 may be sandwiched between the pixel definition layer 230 and the substrate 210 (as shown in FIG. 2), and/or the first part 241 of the first electrode layer 240 may be sandwiched between the pixel definition layer 230 and the first electrode layer 240 (not shown). In general, the structure of the pixel definition layer 230 in the pixel area 211 is typical, and the skilled person in the art should understand other suitable shapes may be utilized in the present invention, such as the pixel definition layer 530.

Figure 6:
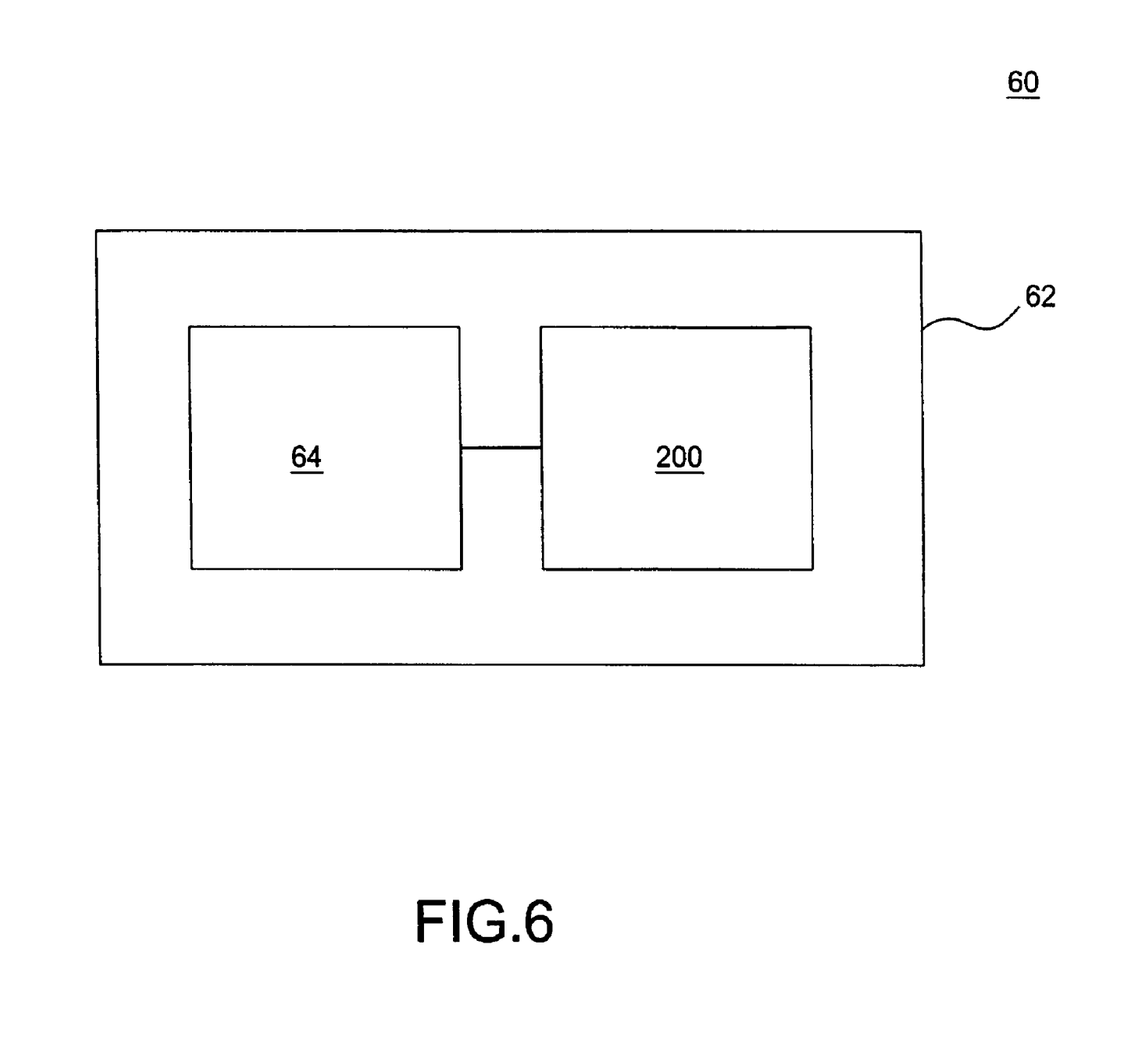
FIG. 6 is a schematic view of an electronic device in accordance with another embodiment of the present invention.

FIG. 6 is a schematic diagram illustrating an electronic device 60 in accordance with a fourth embodiment of the present invention. In FIG. 6, the electronic device 60 includes an image display system 62, which includes an organic light-emitting device and an input unit 64. For example, the electronic device 60 may be a cellular phone, a digital camera, a personal digital assistant (PDA), a laptop computer, a desktop computer, a television, an automobile display, an aircraft display, a global positioning system (GPS), or a portable DVD player, etc. The organic light-emitting device may be an organic light-emitting device 200, 400, or 500 disclosed in the foregoing embodiments or the likes. In this embodiment, the organic light-emitting device 200 is illustrated. Moreover, the input unit 64 is coupled to the organic light-emitting device 200 and configured to providing a signal for controlling the organic light-emitting device 200 to display image.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. An organic light-emitting device, comprising:
a substrate having a pixel area and a peripheral circuit area;
a reflective layer on said substrate, said reflective layer having a first reflective part in said pixel area and a second reflective part in said peripheral circuit area;
a first electrode layer having a first part on said first reflective part;
a pixel definition layer on said substrate, said pixel definition layer defining a plurality of pixel openings to expose a portion of said first part of said first electrode layer, and at least one electrode contact hole to expose a portion of said second reflective part;
an organic light-emitting layer on said first part of said first electrode layer;
a second electrode layer having a first portion located in said pixel area and on said organic light-emitting layer, said second electrode layer having a second portion located in said peripheral circuit area and on said second reflective part, physically and electrically connecting said exposed portion of said second reflective part;
a transistor on said substrate in said pixel area, wherein said transistor comprises a device electrode layer electrically coupling with said first electrode layer; and
a signal electrode layer in said peripheral circuit area, wherein said signal electrode layer and said device electrode layer are formed by a same conductive layer, and said second reflective part electrically couples with said signal electrode layer.

2. The organic light-emitting device of claim 1, further comprising a peripheral circuit system on said substrate in said peripheral circuit area.

3. The organic light-emitting device of claim 1, wherein said second reflective part has a rectangle shape, H shape, U shape or two-parallel-stripe shape.

4. The organic light-emitting device of claim 1, further comprising an additional electrode layer on said exposed portion of said second reflective part, wherein said second electrode layer electrically couples with a portion of said exposed portion of said second reflective part through said additional electrode layer.

5. The organic light-emitting device of claim 4, wherein said additional electrode layer and said first electrode layer are made of a same layer.

6. The organic light-emitting device of claim 1, wherein said reflective layer is a metal layer.

7. The organic light-emitting device of claim 1, wherein a reflectance of said reflective layer is at least 60%.

8. The organic light-emitting device of claim 1, wherein said reflective layer is a multi-layer structure.

9. The organic light-emitting device of claim 1, wherein a portion of said first reflective layer is sandwiched between said pixel definition layer and said substrate.

10. The organic light-emitting device of claim 1, wherein said first reflective part is adjacent to said pixel definition layer in said plurality of pixel openings.

11. A method of forming an organic light-emitting device, comprising:
providing a substrate, said substrate having a pixel area and a peripheral circuit area;
forming a reflective layer on said substrate, said reflective layer having a first reflective part in said pixel area and a second reflective part in said peripheral circuit area;
forming a first electrode layer on said substrate, said first electrode layer having a first part on said first reflective part;
forming a pixel definition layer on said substrate, said pixel definition layer defining a plurality of pixel openings to expose a portion of said first part of said first electrode layer and at least one electrode contact hole to expose a portion of said second reflective part;
forming an organic light-emitting layer on said first electrode layer; and
forming a second electrode layer having a first portion located in said pixel area and on said organic light-emitting layer, said second electrode layer having a second portion located in said peripheral circuit area and on said second reflective part, physically and electrically connecting said exposed portion of said second reflective part,
wherein said step of forming said first electrode layer further comprises forming an additional electrode layer on said exposed portion of said second reflective part simultaneously, and said second electrode layer electrically couples with said exposed portion of said second reflective part through said additional electrode layer.

12. The method of claim 11, wherein said step of forming said reflective layer comprises forming said second reflective part in a rectangle shape, H shape, U shape or two-parallel-stripe shape in said peripheral circuit area.

13. The method of claim 11, wherein said step of forming said pixel definition layer comprises forming said pixel definition layer so that said at least one electrode contact hole exposes all or a portion of said second reflective part.

14. The method of claim 11, wherein said step of forming said pixel definition layer so that a portion of said first reflective layer is sandwiched between said pixel definition layer and said substrate.

15. The method of claim 11, wherein said step of forming said pixel definition layer so that a portion of said first part of said first electrode layer is sandwiched between said pixel definition layer and said first reflective layer.

16. An electronic device, comprising an image display system, said image display system comprising:
an organic light-emitting device as recited in claim 1; and
an input unit coupled to said organic light-emitting device, and configured to provide a signal controlling said organic light-emitting device to display image.

17. The electronic device of claim 16, wherein said electronic device is a cellular phone, a digital camera, a personal digital assistant (PDA), a notebook computer, a tablet computer, a television, an automobile display, an aircraft display, a global positioning system (GPS) or a portable DVD player.

18. An organic light-emitting device, comprising:
a substrate having a pixel area and a peripheral circuit area;
a reflective layer on said substrate, said reflective layer having a first reflective part in said pixel area and a second reflective part in said peripheral circuit area;
a first electrode layer having a first part on said first reflective part;
a pixel definition layer on said substrate, said pixel definition layer defining a plurality of pixel openings to expose a portion of said first part of said first electrode layer, and at least one electrode contact hole to expose a portion of said second reflective part;
an organic light-emitting layer on said first part of said first electrode layer;

a second electrode layer having a first portion located in said pixel area and on said organic light-emitting layer, said second electrode layer having a second portion located in said peripheral circuit area and on said second reflective part, physically and electrically connecting said exposed portion of said second reflective part; and an additional electrode layer on said exposed portion of said second reflective part, wherein said second electrode layer electrically couples with a portion of said exposed portion of said second reflective part through said additional electrode layer.

19. The organic light-emitting device of claim 18, wherein said additional electrode layer and said first electrode layer are made of a same layer.

* * * * *